(12) United States Patent
Singh et al.

(10) Patent No.: US 10,998,200 B2
(45) Date of Patent: *May 4, 2021

(54) HIGH PRESSURE ANNEALING PROCESS FOR METAL CONTAINING MATERIALS

(71) Applicant: Applied Materials, Inc., Santa Clara, CA (US)

(72) Inventors: Kaushal K. Singh, Santa Clara, CA (US); Mei-Yee Shek, Palo Alto, CA (US); Srinivas D. Nemani, Sunnyvale, CA (US); Ellie Y. Yieh, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 179 days.

This patent is subject to a terminal disclaimer.

(21) Appl. No.: 16/262,094

(22) Filed: Jan. 30, 2019

(65) Prior Publication Data
US 2019/0279879 A1    Sep. 12, 2019

Related U.S. Application Data

(60) Provisional application No. 62/641,110, filed on Mar. 9, 2018.

(51) Int. Cl.
*H01L 21/00* (2006.01)
*H01L 21/383* (2006.01)
(Continued)

(52) U.S. Cl.
CPC ............ *H01L 21/383* (2013.01); *C23C 14/48* (2013.01); *C23C 14/5806* (2013.01); *H01L 21/44* (2013.01)

(58) Field of Classification Search
CPC ......... H01L 21/02565; H01L 21/02568; H01L 21/383; H01L 27/1225; H01L 29/41733;
(Continued)

(56) References Cited

U.S. PATENT DOCUMENTS

| 4,524,587 A | 6/1985 | Kantor |
| 4,879,259 A | 11/1989 | Reynolds et al. |

(Continued)

FOREIGN PATENT DOCUMENTS

| CN | 101871043 A | 10/2010 |
| CN | 104047676 A | 9/2014 |

(Continued)

OTHER PUBLICATIONS

Office Action for Japanese Application No. 2018-546484 dated Oct. 8, 2019.
(Continued)

*Primary Examiner* — Brook Kebede
(74) *Attorney, Agent, or Firm* — Patterson + Sheridan, LLP (57) ABSTRACT

The present disclosure provides methods for performing an annealing process on a metal containing layer in TFT display applications, semiconductor or memory applications. In one example, a method of forming a metal containing layer on a substrate includes supplying an oxygen containing gas mixture on a substrate in a processing chamber, the substrate comprising a metal containing layer disposed on an optically transparent substrate, maintaining the oxygen containing gas mixture in the processing chamber at a process pressure between about 2 bar and about 50 bar, and thermally annealing the metal containing layer in the presence of the oxygen containing gas mixture.

20 Claims, 6 Drawing Sheets

(51) Int. Cl.
  *C23C 14/58* (2006.01)
  *C23C 14/48* (2006.01)
  *H01L 21/44* (2006.01)

(58) Field of Classification Search
  CPC ......... H01L 29/42384; H01L 29/66969; H01L 29/7869; C23C 14/48; C23C 14/5806
  USPC ....................................................... 438/104
  See application file for complete search history.

(56) References Cited

U.S. PATENT DOCUMENTS

| | | | |
|---|---|---|---|
| 5,050,540 A | 9/1991 | Lindberg | |
| 5,114,513 A | 5/1992 | Hosokawa et al. | |
| 5,126,117 A | 6/1992 | Schumacher et al. | |
| 5,149,378 A | 9/1992 | Ohmi et al. | |
| 5,175,123 A | 12/1992 | Vasquez et al. | |
| 5,319,212 A | 6/1994 | Tokoro | |
| 5,366,905 A | 11/1994 | Mukai | |
| 5,578,132 A | 11/1996 | Yamaga et al. | |
| 5,590,695 A | 1/1997 | Siegele et al. | |
| 5,620,524 A | 4/1997 | Fan et al. | |
| 5,808,245 A | 9/1998 | Wiese et al. | |
| 5,858,051 A | 1/1999 | Komiyama et al. | |
| 5,879,756 A | 3/1999 | Fathi et al. | |
| 5,880,041 A | 3/1999 | Ong | |
| 5,940,985 A | 8/1999 | Kamikawa et al. | |
| 6,082,950 A | 7/2000 | Altwood et al. | |
| 6,136,664 A | 10/2000 | Economikos et al. | |
| 6,150,286 A | 11/2000 | Sun et al. | |
| 6,164,412 A | 12/2000 | Allman | |
| 6,242,368 B1 | 6/2001 | Holmer et al. | |
| 6,251,751 B1 | 6/2001 | Chu et al. | |
| 6,299,753 B1 | 10/2001 | Chao et al. | |
| 6,319,766 B1 | 11/2001 | Bakli et al. | |
| 6,334,266 B1 | 1/2002 | Moritz et al. | |
| 6,368,412 B1 | 4/2002 | Gomi | |
| 6,442,980 B2 | 9/2002 | Preston et al. | |
| 6,468,490 B1 | 10/2002 | Shamouilian et al. | |
| 6,500,603 B1 | 12/2002 | Shioda | |
| 6,583,497 B2 | 6/2003 | Xia et al. | |
| 6,619,304 B2 | 9/2003 | Worm | |
| 6,797,336 B2 | 9/2004 | Garvey et al. | |
| 7,055,333 B2 | 6/2006 | Leitch et al. | |
| 7,084,079 B2 | 8/2006 | Conti et al. | |
| 7,111,630 B2 | 9/2006 | Mizobata et al. | |
| 7,114,517 B2 | 10/2006 | Sund et al. | |
| 7,211,525 B1 | 5/2007 | Shanker et al. | |
| 7,282,458 B2 | 10/2007 | Gates et al. | |
| 7,361,231 B2 | 4/2008 | Fury et al. | |
| 7,460,760 B2 | 12/2008 | Cho et al. | |
| 7,491,658 B2 | 2/2009 | Nguyen et al. | |
| 7,503,334 B1 | 3/2009 | Shrinivasan et al. | |
| 7,521,089 B2 | 4/2009 | Hillman et al. | |
| 7,521,378 B2 | 4/2009 | Fucsko et al. | |
| 7,541,297 B2 | 6/2009 | Mallick et al. | |
| 7,576,441 B2 | 8/2009 | Yin et al. | |
| 7,650,965 B2 | 1/2010 | Thayer et al. | |
| 7,651,959 B2 | 1/2010 | Fukazawa et al. | |
| 7,655,532 B1 | 2/2010 | Chen et al. | |
| 7,825,038 B2 | 11/2010 | Ingle et al. | |
| 7,825,042 B2 | 11/2010 | Mandal | |
| 7,867,923 B2 | 1/2011 | Mallick et al. | |
| 7,891,228 B2 | 2/2011 | Ding et al. | |
| 8,027,089 B2 | 9/2011 | Hayashi | |
| 8,306,026 B2 | 11/2012 | Anjum et al. | |
| 8,318,584 B2 | 11/2012 | Li et al. | |
| 8,349,085 B2 | 1/2013 | Tahara et al. | |
| 8,449,942 B2 | 5/2013 | Li et al. | |
| 8,455,368 B2 | 6/2013 | Chandler et al. | |
| 8,466,073 B2 | 6/2013 | Wang et al. | |
| 8,481,123 B2 | 7/2013 | Kim et al. | |
| 8,536,065 B2 | 9/2013 | Seamons et al. | |
| 8,557,712 B1 | 10/2013 | Antonelli et al. | |
| 8,563,445 B2 | 10/2013 | Liang et al. | |
| 8,647,992 B2 | 2/2014 | Liang et al. | |
| 8,741,788 B2 | 6/2014 | Liang et al. | |
| 8,871,656 B2 | 10/2014 | Mallick et al. | |
| 8,906,761 B2 | 12/2014 | Kim et al. | |
| 8,936,834 B2 | 1/2015 | Kim et al. | |
| 9,121,515 B2 | 9/2015 | Yamamoto et al. | |
| 9,153,442 B2 | 10/2015 | Wang et al. | |
| 9,157,730 B2 | 10/2015 | Rajagopalan et al. | |
| 9,257,314 B1 | 2/2016 | Rivera et al. | |
| 9,306,026 B2 | 4/2016 | Toriumi et al. | |
| 9,362,107 B2 | 6/2016 | Thadani et al. | |
| 9,484,406 B1 | 11/2016 | Sun et al. | |
| 9,570,551 B1 | 2/2017 | Balakrishnan et al. | |
| 10,083,834 B2 | 9/2018 | Thompson et al. | |
| 10,096,516 B1 | 10/2018 | Leschkies et al. | |
| 10,276,411 B2 | 4/2019 | Delmas et al. | |
| 2001/0029108 A1 | 10/2001 | Tometsuka | |
| 2001/0041122 A1 | 11/2001 | Kroeker | |
| 2001/0050096 A1 | 12/2001 | Costantini et al. | |
| 2002/0066535 A1 | 6/2002 | Brown et al. | |
| 2002/0073922 A1 | 6/2002 | Frankel et al. | |
| 2002/0122885 A1 | 9/2002 | Ahn | |
| 2002/0134439 A1 | 9/2002 | Kawasaki et al. | |
| 2002/0148492 A1 | 10/2002 | Yamagata et al. | |
| 2002/0151128 A1 | 10/2002 | Lane et al. | |
| 2002/0155714 A1 | 10/2002 | Suzuki | |
| 2003/0030945 A1 | 2/2003 | Heinonen et al. | |
| 2003/0049372 A1 | 3/2003 | Cook et al. | |
| 2003/0101938 A1 | 6/2003 | Ronsse et al. | |
| 2003/0148035 A1 | 8/2003 | Lingampalli | |
| 2003/0148631 A1 | 8/2003 | Kuo et al. | |
| 2003/0207593 A1 | 11/2003 | Derderian et al. | |
| 2004/0025908 A1 | 2/2004 | Douglas et al. | |
| 2004/0060519 A1 | 4/2004 | Beauchaine et al. | |
| 2004/0074869 A1 | 4/2004 | Wang et al. | |
| 2004/0112409 A1 | 6/2004 | Schilling | |
| 2004/0219800 A1 | 11/2004 | Tognetti | |
| 2004/0248392 A1 | 12/2004 | Narwankar et al. | |
| 2005/0003655 A1 | 1/2005 | Cathey et al. | |
| 2005/0051194 A1 | 3/2005 | Sakashita et al. | |
| 2005/0136684 A1 | 6/2005 | Mukai et al. | |
| 2005/0191828 A1 | 9/2005 | Al-Bayati et al. | |
| 2005/0198971 A1 | 9/2005 | Leitch et al. | |
| 2005/0250347 A1 | 11/2005 | Bailey et al. | |
| 2005/0269291 A1 | 12/2005 | Kent | |
| 2006/0003596 A1 | 1/2006 | Fucsko et al. | |
| 2006/0105107 A1 | 5/2006 | Lindeboom et al. | |
| 2006/0124613 A1 | 6/2006 | Kumar et al. | |
| 2006/0175012 A1 | 8/2006 | Lee | |
| 2006/0207633 A1 | 9/2006 | Kim et al. | |
| 2006/0226117 A1 | 10/2006 | Bertram et al. | |
| 2006/0279025 A1 | 12/2006 | Heidari et al. | |
| 2006/0290017 A1 | 12/2006 | Yanagisawa | |
| 2007/0012402 A1 | 1/2007 | Sneh | |
| 2007/0045753 A1 | 3/2007 | Pae et al. | |
| 2007/0187386 A1 | 8/2007 | Kim et al. | |
| 2007/0204797 A1 | 9/2007 | Fischer | |
| 2007/0212850 A1 | 9/2007 | Ingle et al. | |
| 2007/0243317 A1 | 10/2007 | Du Bois et al. | |
| 2007/0256559 A1 | 11/2007 | Chen et al. | |
| 2008/0074658 A1 | 3/2008 | Davis et al. | |
| 2008/0083109 A1 | 4/2008 | Shibata et al. | |
| 2008/0115726 A1 | 5/2008 | Ingle et al. | |
| 2008/0121882 A1 | 5/2008 | Hwang et al. | |
| 2008/0210273 A1 | 9/2008 | Joe | |
| 2008/0251904 A1 | 10/2008 | Theuss et al. | |
| 2009/0018688 A1 | 1/2009 | Chandler et al. | |
| 2009/0081884 A1 | 3/2009 | Yokota et al. | |
| 2009/0110622 A1 | 4/2009 | Chiu et al. | |
| 2009/0148965 A1 | 6/2009 | Kim et al. | |
| 2009/0180847 A1 | 7/2009 | Guo et al. | |
| 2009/0186481 A1 | 7/2009 | Suzuki et al. | |
| 2009/0233449 A1 | 9/2009 | Lebouitz et al. | |
| 2009/0243126 A1 | 10/2009 | Washiya et al. | |
| 2010/0006211 A1 | 1/2010 | Wolk et al. | |
| 2010/0012292 A1 | 1/2010 | Yamazaki | |
| 2010/0022068 A1 | 1/2010 | Chen et al. | |
| 2010/0173495 A1 | 7/2010 | Thakur et al. | |
| 2010/0304027 A1 | 12/2010 | Lee et al. | |

(56) References Cited

U.S. PATENT DOCUMENTS

| | | |
|---|---|---|
| 2010/0320459 A1 | 12/2010 | Umeda et al. |
| 2010/0327422 A1 | 12/2010 | Lee et al. |
| 2011/0151677 A1 | 6/2011 | Wang et al. |
| 2011/0165781 A1 | 7/2011 | Liang et al. |
| 2011/0198736 A1 | 8/2011 | Shero et al. |
| 2011/0263091 A1* | 10/2011 | Yamazaki ......... H01L 21/02565 438/287 |
| 2012/0048304 A1 | 3/2012 | Kitajima et al. |
| 2012/0056173 A1 | 3/2012 | Pieralisi |
| 2012/0060868 A1 | 3/2012 | Gray |
| 2012/0142192 A1 | 6/2012 | Li et al. |
| 2012/0175822 A1 | 7/2012 | Inamiya et al. |
| 2012/0252210 A1 | 10/2012 | Tohnoe |
| 2012/0285492 A1 | 11/2012 | Lee et al. |
| 2012/0304485 A1 | 12/2012 | Hayashi et al. |
| 2013/0194350 A1 | 8/2013 | Watanabe et al. |
| 2013/0233170 A1 | 9/2013 | Spiegelman et al. |
| 2013/0288485 A1 | 10/2013 | Liang et al. |
| 2013/0302916 A1 | 11/2013 | Kim et al. |
| 2013/0330042 A1 | 12/2013 | Nara et al. |
| 2013/0337171 A1 | 12/2013 | Sasagawa |
| 2014/0023320 A1 | 1/2014 | Lee et al. |
| 2014/0045300 A1 | 2/2014 | Chen et al. |
| 2014/0076494 A1 | 3/2014 | Miyashita et al. |
| 2014/0134827 A1 | 5/2014 | Swaminathan et al. |
| 2014/0138802 A1 | 5/2014 | Starostine et al. |
| 2014/0183743 A1 | 7/2014 | Matsumoto et al. |
| 2014/0231384 A1 | 8/2014 | Underwood et al. |
| 2014/0235068 A1 | 8/2014 | Ashihara et al. |
| 2014/0239291 A1 | 8/2014 | Son et al. |
| 2014/0264237 A1 | 9/2014 | Chen et al. |
| 2014/0268080 A1 | 9/2014 | Beasley et al. |
| 2014/0284821 A1 | 9/2014 | Hubbard |
| 2014/0322921 A1 | 10/2014 | Ahmad et al. |
| 2015/0000870 A1 | 1/2015 | Hosotani et al. |
| 2015/0050807 A1 | 2/2015 | Wu et al. |
| 2015/0056819 A1 | 2/2015 | Wong et al. |
| 2015/0091009 A1 | 4/2015 | Yamazaki et al. |
| 2015/0099342 A1 | 4/2015 | Tsai et al. |
| 2015/0159272 A1 | 6/2015 | Yoon et al. |
| 2015/0179501 A1 | 6/2015 | Jhaveri et al. |
| 2015/0255581 A1 | 9/2015 | Lin et al. |
| 2015/0292736 A1 | 10/2015 | Hirson et al. |
| 2015/0309073 A1 | 10/2015 | Mirkin et al. |
| 2015/0322286 A1 | 11/2015 | Cabrini et al. |
| 2015/0364348 A1 | 12/2015 | Park et al. |
| 2016/0027887 A1 | 1/2016 | Yuan et al. |
| 2016/0035600 A1 | 2/2016 | Rivera et al. |
| 2016/0064209 A1 | 3/2016 | Lee et al. |
| 2016/0064482 A1 | 3/2016 | Hashemi et al. |
| 2016/0076149 A1 | 3/2016 | Yamazaki et al. |
| 2016/0086831 A1 | 3/2016 | Rivera et al. |
| 2016/0111272 A1 | 4/2016 | Girard et al. |
| 2016/0118391 A1 | 4/2016 | Zhao et al. |
| 2016/0163540 A1 | 6/2016 | Liao et al. |
| 2016/0208414 A1 | 7/2016 | Odawara et al. |
| 2016/0260526 A1 | 9/2016 | Otto |
| 2016/0273758 A1 | 9/2016 | Fujimura |
| 2016/0274454 A1 | 9/2016 | Beasley et al. |
| 2016/0314964 A1 | 10/2016 | Tang et al. |
| 2016/0334162 A1 | 11/2016 | Kim et al. |
| 2016/0336405 A1 | 11/2016 | Sun et al. |
| 2016/0353522 A1 | 12/2016 | Rathi et al. |
| 2017/0005204 A1 | 1/2017 | Hosoba et al. |
| 2017/0011932 A1 | 1/2017 | Pethe et al. |
| 2017/0084487 A1 | 3/2017 | Chebiam et al. |
| 2017/0104062 A1 | 4/2017 | Bi et al. |
| 2017/0140996 A1 | 5/2017 | Lin et al. |
| 2017/0160012 A1 | 6/2017 | Kobayashi et al. |
| 2017/0162413 A1 | 6/2017 | Rebstock |
| 2017/0194430 A1 | 7/2017 | Wood et al. |
| 2017/0253968 A1 | 9/2017 | Yahata |
| 2017/0263702 A1 | 9/2017 | Chan et al. |
| 2017/0314125 A1 | 11/2017 | Fenwick et al. |
| 2017/0358483 A1 | 12/2017 | Roy et al. |
| 2018/0019249 A1 | 1/2018 | Zhang et al. |
| 2018/0023192 A1 | 1/2018 | Chandra et al. |
| 2018/0261480 A1 | 9/2018 | Liang et al. |
| 2018/0286674 A1 | 10/2018 | Manna et al. |
| 2018/0315626 A1 | 11/2018 | Franklin |
| 2018/0337027 A1 | 11/2018 | L'Heureux et al. |
| 2018/0342384 A1 | 11/2018 | Wong et al. |
| 2018/0350563 A1 | 12/2018 | Manna et al. |
| 2019/0057879 A1 | 2/2019 | Delmas et al. |
| 2019/0119769 A1 | 4/2019 | Khan et al. |
| 2019/0139793 A1 | 5/2019 | Delmas et al. |
| 2019/0148178 A1 | 5/2019 | Liang et al. |
| 2019/0148186 A1 | 5/2019 | Schaller et al. |
| 2019/0157074 A1 | 5/2019 | Delmas |
| 2019/0228982 A1 | 7/2019 | Chen et al. |
| 2019/0237345 A1 | 8/2019 | Delmas et al. |
| 2019/0258153 A1 | 8/2019 | Nemani et al. |
| 2019/0259625 A1 | 8/2019 | Nemani et al. |
| 2019/0311896 A1 | 10/2019 | Balseanu et al. |
| 2019/0368035 A1 | 12/2019 | Malik et al. |
| 2020/0035509 A1 | 1/2020 | Khan et al. |
| 2020/0035513 A1 | 1/2020 | Khan et al. |
| 2020/0098574 A1 | 3/2020 | Wong et al. |

FOREIGN PATENT DOCUMENTS

| | | |
|---|---|---|
| CN | 104089491 A | 10/2014 |
| JP | 63-004616 | 1/1988 |
| JP | 06-283496 | 10/1994 |
| JP | H07048489 B2 | 5/1995 |
| JP | 2001110729 A | 4/2001 |
| JP | 2003-51474 A | 2/2003 |
| JP | 2004127958 A | 4/2004 |
| JP | 2005064269 A | 3/2005 |
| JP | 2005-333015 A | 12/2005 |
| JP | 2007242791 A | 9/2007 |
| JP | 2008/073611 A | 4/2008 |
| JP | 2009-129927 A | 6/2009 |
| JP | 2010-205854 A | 9/2010 |
| JP | 2012-503883 A | 2/2012 |
| JP | 2012-204656 A | 10/2012 |
| JP | 2013-105777 A | 5/2013 |
| JP | 2013516788 A | 5/2013 |
| JP | 2013-179244 A | 9/2013 |
| JP | 2014019912 A | 2/2014 |
| KR | 20030052162 A | 6/2003 |
| KR | 20070075383 A | 7/2007 |
| KR | 20090011463 A | 2/2009 |
| KR | 1020090040867 A | 4/2009 |
| KR | 10-2009-0064279 A | 6/2009 |
| KR | 10-2010-0035000 A | 4/2010 |
| KR | 20110136532 A | 12/2011 |
| KR | 101287035 B1 | 7/2013 |
| KR | 101305904 B1 | 9/2013 |
| KR | 20140003776 A | 1/2014 |
| KR | 20140135744 A | 11/2014 |
| KR | 20150006587 A | 1/2015 |
| KR | 20150122432 A | 11/2015 |
| TW | 200529284 A | 9/2005 |
| TW | 200721316 A | 6/2007 |
| TW | 201507174 A | 2/2015 |
| WO | 2005057663 A2 | 6/2005 |
| WO | 2008/089178 A2 | 7/2008 |
| WO | 2011/103062 A2 | 8/2011 |
| WO | 2012/133583 A1 | 10/2012 |
| WO | 2016/018593 A1 | 2/2016 |
| WO | 2016065219 A1 | 4/2016 |

OTHER PUBLICATIONS

International Search Report and Written Opinion for International Application No. PCT/US2019/040195 dated Oct. 25, 2019.

Taiwan Office Action dated Nov. 19, 2019 for Application No. 108103415.

Office Action for Japanese Application No. 2018-517285 dated Oct. 23, 2019.

Office Action for Taiwan Patent Application No. 108111501 dated Nov. 14, 2019.

(56) References Cited

OTHER PUBLICATIONS

International Search Report and Written Opinion for PCT/US2018/050464 dated Jan. 4, 2019.
International Search Report and Written Opinion for PCT/US2019/056447 dated Feb. 7, 2020.
KR Office Action dated Feb. 4, 2020 for Application No. 10-2018-0133399.
Taiwan Office Action dated Feb. 21, 2020 for Application No. 108138212.
International Search Report and Written Opinion for International Application No. PCT/US2019/059659 dated Feb. 26, 2020.
Office Action from Taiwan Patent Application No. 108104585 dated Jan. 30, 2020, with concise statement of relevance.
Pedestal definition from Dictionary.com, printed on Feb. 10, 2020 (year 2020).
International Search Report and Written Opinion for PCT/US2018/021715 dated Jun. 22, 2018.
International Search Report and Written Opinion from PCT/US2018/034036 dated Aug. 24, 2018.
International Search Report and Written Opinion dated Aug. 24, 2018 for Application No. PCT/US2018/034284.
International Search Report, Application No. PCT/US2018/028258 dated Aug. 9, 2018.
International Search Report and Written Opinion for PCT/US2018/035210 dated Aug. 24, 2018.
International Search Report and Written Opinion for PCT/US2018/037539 dated Oct. 5, 2018.
International Search Report and Written Opinion for PCT/US2018/038822 dated Oct. 26, 2018.
Chen, Yang et al., "Analysis of Supercritical Carbon Dioxide Heat Exchangers in Cooling Process", International Refrigeration and Air Conditioning Conference at Purdue, Jul. 17-20, 2006, pp. 1-8.
Shimoyama, Takehiro et al., "Porous Aluminum for Heat Exchanger", Hitachi Chemical, pp. 19-20.
Kato, T. et al., "Heat Transfer Characteristics of a Plate-Fin Type Supercritical/Liquid Helium Heat Exchanger", ICEC 14 Proceedings Supplement, 1992, pp. 260-263.
Lee, Ho-Saeng et al., "The cooling heat transfer characteristics of the supercritical CO2 in mico-fin tube", Springer, Oct. 2, 2012, pp. 173-184.
International Search Report and Written Opinion dated Nov. 30, 2018 for Application No. PCT/US2018/041688.
Taiwan Office Action dated Jun. 11, 2019 for Application No. 107138905.
International Search Report and Written Opinion for International Application No. PCT/US2019/029602 dated Aug. 14, 2019.
International Search Report and Written Opinion for PCT/US2019/015332 dated May 15, 2019.
International Search Report and Written Opinion for PCT/US2018/059676 dated May 23, 2019.
International Search Report and Written Opinion for PCT/US2019/023431 dated Jul. 5, 2019.
Haskel Pressure on Demand, Pneumatic and Hydraulic Driven Gas Boosters, Apr. 30, 2016, 36 pp.
Taiwan Office Action dated Jul. 3, 2019 for Application No. 107136181.
International Search Report and Written Opinion for PCT/US2018/043160 dated Jan. 31, 2019.
International Search Report and Written Opinion for PCT/US2018/059643 dated Feb. 26, 2019.
International Search Report and Written Opinion from PCT/US2019/012161 dated Apr. 30, 2019.
International Search Report and Written Opinion for PCT/US2019/014759 dated May 14, 2019.

\* cited by examiner

HIGH PRESSURE ANNEALING PROCESS FOR METAL CONTAINING MATERIALS

CROSS-REFERENCE TO RELATED APPLICATIONS

This application claims benefit of U.S. Provisional Application Ser. No. 62/641,110 filed Mar. 9, 2018, which is incorporated by reference in their entirety.

BACKGROUND

Field

Embodiments of the present invention generally relate to a method for forming a metal containing layer in a film stack that may be utilized in TFT device structures, semiconductor, or memory applications.

Description of the Related Art

Display devices have been widely used for a wide range of electronic applications, such as TV, monitors, mobile phone, MP3 players, e-book readers, and personal digital assistants (PDAs) and the like. The display device is generally designed for producing desired image by applying an electric field to a liquid crystal that fills a gap between two substrates and has anisotropic dielectric constant that controls the intensity of the dielectric field. By adjusting the amount of light transmitted through the substrates, the light and image intensity, quality and power consumption may be efficiently controlled.

A variety of different display devices, such as active matrix liquid crystal display (AMLCD) or an active matrix organic light emitting diodes (AMOLED), may be employed as light sources for display devices which utilize touch screen panels. In the manufacturing of TFT devices, an electronic device with high electron mobility, low leakage current and high breakdown voltage, would allow more pixel area for light transmission and integration of circuitry, thus resulting in a brighter display, higher overall electrical efficiency, faster response time and higher resolution displays. Low film qualities of the material layers, such as metal electrode layer with impurities, formed in the device often result in poor device electrical performance and short service life of the devices. Thus, a stable and reliable method for forming and integrating film layers with in a TFT devices becomes crucial to provide a device structure with low film leakage, and high breakdown voltage, for use in manufacturing electronic devices with lower threshold voltage shift and improved the overall performance of the electronic device are desired.

Therefore, there is a need for improved materials for manufacturing TFT devices that produce improved device electrical performance and device stability.

SUMMARY

The present disclosure provides methods for performing an annealing process on a metal containing layer in TFT display applications, semiconductor or resistive random access memory (ReRAM). In one example, a method of forming a metal containing layer on a substrate includes supplying an oxygen containing gas mixture on a substrate in a processing chamber, the substrate comprising a metal containing layer disposed on an optically transparent substrate, maintaining the oxygen containing gas mixture in the processing chamber at a process pressure between 2 bar and 50 bar, and thermally annealing the metal containing layer in the presence of the oxygen containing gas mixture.

In another example, a method for densifying a metal containing layer disposed on a substrate includes thermally treating a metal containing layer disposed on an optically transparent substrate at a pressure greater than 2 bar, and maintaining a substrate temperature less than 500 degrees Celsius during thermally treating the dielectric layer.

In yet another example, a method for densifying a metal containing layer disposed on a substrate includes forming a metal containing layer on a substrate, implanting dopants into the metal containing layer and thermally treating the metal containing layer on the substrate at a pressure greater than 2 bar while maintaining the substrate temperature less than 500 degrees Celsius.

DETAILED DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, such as anneal at atmospheric pressure with similar anneal conditions where possible, to designate identical elements that are common to the figures. It is contemplated that elements and features of one embodiment may be beneficially incorporated in other embodiments without further recitation.

It is to be noted, however, that the appended drawings illustrate only exemplary embodiments of this invention and are therefore not to be considered limiting of its scope, for the invention may admit to other equally effective embodiments.

DETAILED DESCRIPTION

Embodiments of the disclosure generally provide a TFT device structures and methods of performing a thermal annealing process on an active layer of source, drain, interface and contact regions in the TFT device structures so as to enhance electrical performance for display devices. Other applications, including semiconductor or memory device manufacturing process, may also utilize the embodiments described herein. The thermal annealing process may densify the active layer film properties of the metal electrodes, source/drain and/or contact regions, and/or film layers on the substrate. In one example, the thermal treatment process is performed to provide thermal energy of a metal containing layer, such as a metal containing layer (e.g., an active layer) or a metal electrode layer (e.g., a metal gate electrode, a source-drain and/or contact regions or electrode layers, or other suitable metal structures) is formed in the TFT devices. The thermal annealing process may densify or minimize oxygen deficiency in the active layer film structures to provide good quality, interface management and thermal stabilization to the device structure. The thermal annealing process may also increase the degree of crystalline of the metal containing material, improving electrical performance of the metal containing layer. Thus, desired film properties of metal electrodes and active layers of source/drain and/or contact regions in display devices may efficiently enhance the electrical performance of transistor and diode devices.

Figure 1:
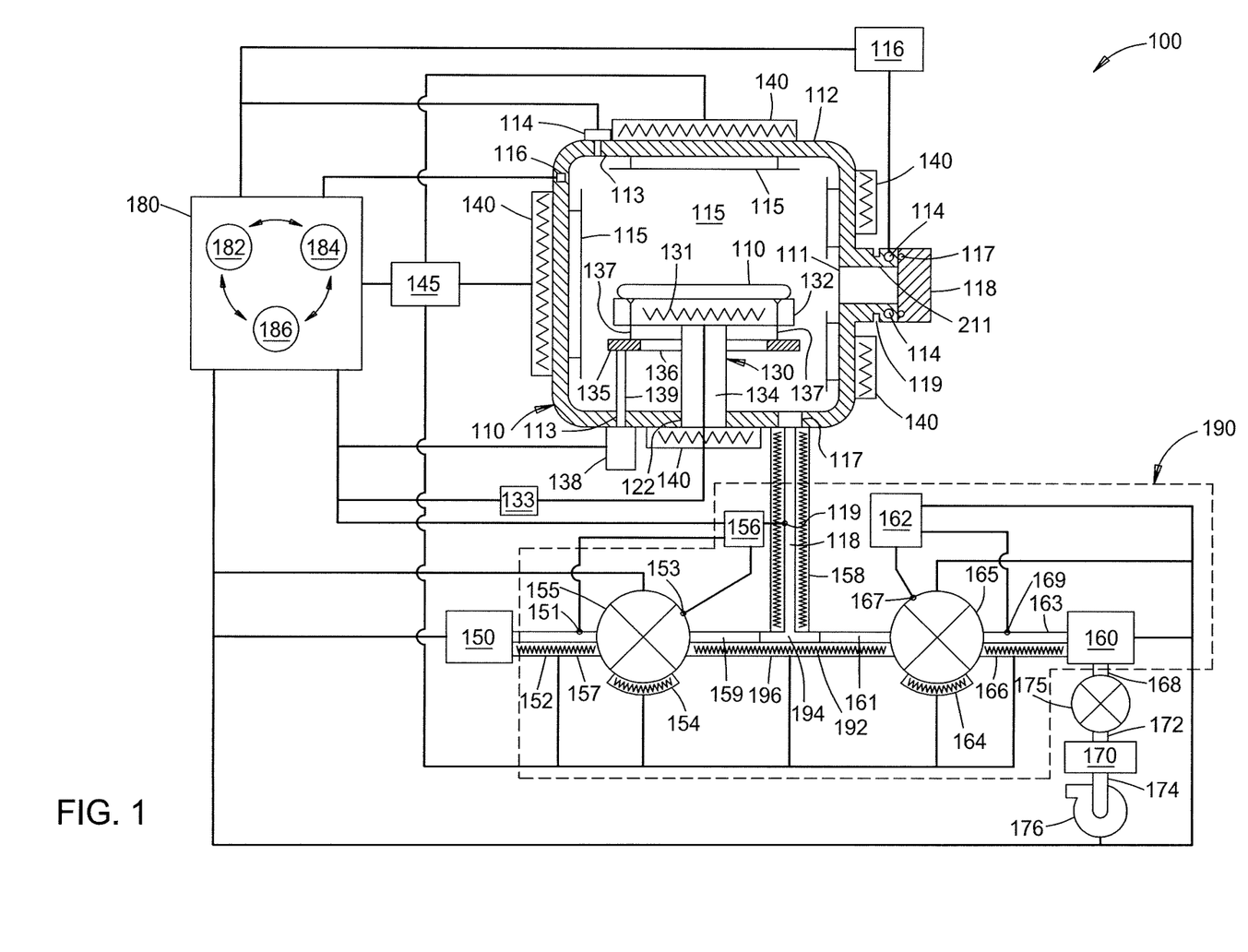
FIG. 1 is a simplified front cross-sectional view of a processing chamber with a cassette disposed therein in accordance with some embodiments.

FIG. 1 is a simplified front cross-sectional view of a single-substrate processing chamber 100 for a high-pressure annealing process of a single substrate. The single-substrate processing chamber 100 has a body 110 with an outer surface 112 and an inner surface 113 that encloses an internal volume 115. In some embodiments such as in FIG. 1, the body 110 has an annular cross section, though in other embodiments the cross-section of the body 110 may be rectangular or any closed shape. The outer surface 112 of the body 110 may be made from a corrosion resistant steel (CRS), such as but not limited to stainless steel. One or more heat shields 125 are disposed on the inner surface 113 of the body 110 that prevents heat loss from the single-substrate processing chamber 100 into the outside environment. The inner surface 113 of the body 110 as well as the heat shields 125 may be made from nickel-based steel alloys that exhibit high resistance to corrosion, such as but not limited to HASTELLOY®, ICONEL®, and MONEL®.

A substrate support 130 is disposed within the internal volume 115. The substrate support 130 has a stem 134 and a substrate-supporting member 132 held by the stem 134. The stem 134 passes through a passage 122 formed through the chamber body 110. A rod 139 connected to an actuator 138 passes through a second passage 123 formed through the chamber body 110. The rod 139 is coupled to a plate 135 having an aperture 136 accommodating the stem 134 of the substrate support 130. Lift pins 137 are connected to the substrate-supporting member 132. The actuator 138 actuates the rod 139 such that the plate 135 is moved up or down to connect and disconnect with the lift pins 137. As the lift pins 137 are raised or lowered, the substrate-supporting member 132 is raised or lowered within the internal volume 115 of the chamber 100. The substrate-supporting member 132 has a resistive heating element 131 embedded centrally within. A power source 133 is configured to electrically power the resistive heating element 131. The operation of the power source 133 as well as the actuator 138 is controlled by a controller 180.

The single-substrate processing chamber 100 has an opening 111 on the body 110 through which one or more substrates 120 can be loaded and unloaded to and from the substrate support 130 disposed in the internal volume 115. The opening 111 forms a tunnel 121 on the body 110. A slit valve 128 is configured to sealably close the tunnel 121 such that the opening 111 and the internal volume 115 can only be accessed when the slit valve 128 is open. A high-pressure seal 127 is utilized to seal the slit valve 128 to the body 110 in order to seal the internal volume 115 for processing. The high-pressure seal 127 may be made from a polymer, for example a fluoropolymer, such as but not limited to a perfluoroelastomer and polytetrafluoroethylene (PTFE). The high-pressure seal 127 may further include a spring member for biasing the seal to improve seal performance. A cooling channel 124 is disposed on the tunnel 121 adjacent to the high-pressure seals 127 in order to maintain the high-pressure seals 127 below the maximum safe-operating temperature of the high-pressure seals 127 during processing. A cooling agent from a cooling fluid source 126, such as but not limited to an inert, dielectric, and high-performance heat transfer fluid, may be circulated within the cooling channel 124. The flow of the cooling agent from the cooling fluid source 126 is controlled by the controller 180 through feedback received from a temperature sensor 116 or a flow sensor (not shown). An annular-shaped thermal choke 129 is formed around the tunnel 221 to prevent the flow of heat from the internal volume 115 through the opening 111 when the slit valve 128 is open.

The single-substrate processing chamber 100 has a port 117 through the body 110, which is fluidly connected to a fluid circuit 190 connecting the gas panel 150, the condenser 160 and the port 117. The fluid circuit 190 has a gas conduit 192, a source conduit 157, an inlet isolation valve 155, an exhaust conduit 163, and an outlet isolation valve 165. A number of heaters 196, 158, 152, 154, 164, 166 are interfaced with different portions of the fluid circuit 190. A number of temperature sensors 151, 153, 119, 167 and 169 are also placed at different portions of the fluid circuit 190 to take temperature measurements and send the information to the controller 180. The controller 180 uses the temperature measurement information to control the operation of the heaters 152, 154, 158, 196, 164, and 166 such that the temperature of the fluid circuit 190 is maintained at a temperature above the condensation point of the processing fluid disposed in the fluid circuit 190 and the internal volume 115.

The gas panel 150 is configured to provide a processing fluid under pressure the internal volume 115. The pressure of the processing fluid introduced into the internal volume 115 is monitored by a pressure sensor 114 coupled to the body 110. The condenser 160 is fluidly coupled to a cooling fluid source (not shown) and configured to condense the gas phase processing fluid exiting the internal volume 115 through the gas conduit 192. The condensed processing fluid is then removed by the pump 176. One or more heaters 140 are disposed on the body 110 and configured to heat the internal volume 115 within the single-substrate processing chamber 100. The heaters 140, 152, 154, 158, 196, 164, and 166 maintain the processing fluid within the fluid circuit 190 in a gaseous phase while the outlet isolation valve 165 to the condenser 160 is open to prevent condensation within the fluid circuit.

The controller 180 controls the operation of the single-substrate processing chamber 100. The controller 180 controls the operation of the gas panel 150, the condenser 160, the pump 170, the inlet isolation valve 155, the outlet isolation valve 165, the power sources 133 and 145. The controller 180 is also communicatively connected to the temperature sensor 116, the pressure sensor 114, the actuator 138, the cooling fluid source 126 and the temperature reading devices 156 and 162.

The processing fluid may comprise an oxygen-containing and/or nitrogen-containing gas, and/or chalcogen or tellurium (such as S, Se, Te) gases or vapors such as oxygen, dry steam, water, hydrogen peroxide, ammonia, S vapor, Se vapor, $H_2S$, $H_2Se$, etc. The processing fluid may be reacted with the metal materials on the substrate to form metal oxynidrids, metal oxides, metal oxychalcogenides or metal chalcogenides. Alternatively or in addition to the oxygen-containing and/or nitrogen-containing gases, the processing fluid may comprise a silicon-containing gas. Examples of the silicon-containing gas include organosilicon, tetraalkyl orthosilicate gases and disiloxane. Organosilicon gases include gases of organic compounds having at least one carbon-silicon bond. Tetraalkyl orthosilicate gases include gases consisting of four alkyl groups attached to an $SiO_4^{4-}$ ion. More particularly, the one or more gases may be (dimethylsilyl)(trimethylsilyl)methane (($Me)_3SiCH_2SiH(Me)_2$), hexamethyldisilane (($Me)_3SiSi(Me)_3$), trimethylsilane (($Me)_3SiH$), trimethylsilylchloride (($Me)_3SiCl$), tetramethylsilane (($Me)_4Si$), tetraethoxysilane (($EtO)_4Si$), tetramethoxysilane (($MeO)_4Si$), tetrakis-(trimethylsilyl)silane (($Me_3Si)_4Si$), (dimethylamino)dimethyl-silane (($Me_2N)SiHMe_2$) dimethyldiethoxysilane (($EtO)_2Si(Me)_2$), dimethyl-dimethoxysilane (($MeO)_2Si(Me)_2$), methyltrimethoxysilane (($MeO)_3Si(Me)$), dimethoxytetramethyldisiloxane ((($Me)_2Si(OMe))_2O$), tris(dimethylamino)silane (($Me_2N)_3SiH$), bis(dimethylamino)methylsilane (($Me_2N)_2CH_3SiH$), disiloxane (($SiH_3)_2O$), and combinations thereof.

During processing of the substrates 120, an environment of the high-pressure region 115 is maintained at a temperature and pressure that maintains the processing fluid within the high-pressure region in a vapor phase. Such pressure and temperature is selected based on the composition of the processing fluid. In the case of steam, the temperature and pressure is held at a condition that maintains the steam in a dry steam state. In one example, high-pressure region 115 is pressurized to a pressure greater than atmosphere, for example greater than about 2 bars. In another example, high-pressure region 115 is pressurized to a pressure from between about 10 and about 50 bars, such as from between about 20 and about 50 bars. In another example, the high-pressure region 115 is pressurized to a pressure up to about 100 bars. During processing, the high-pressure region 115 is also maintained at a high temperature, for example, a temperature exceeding 225 degrees Celsius (limited by the thermal budget of the substrates 155 disposed on the cassette 150), such as between about 300 degrees Celsius and about 500 degrees Celsius.

Figure 2:
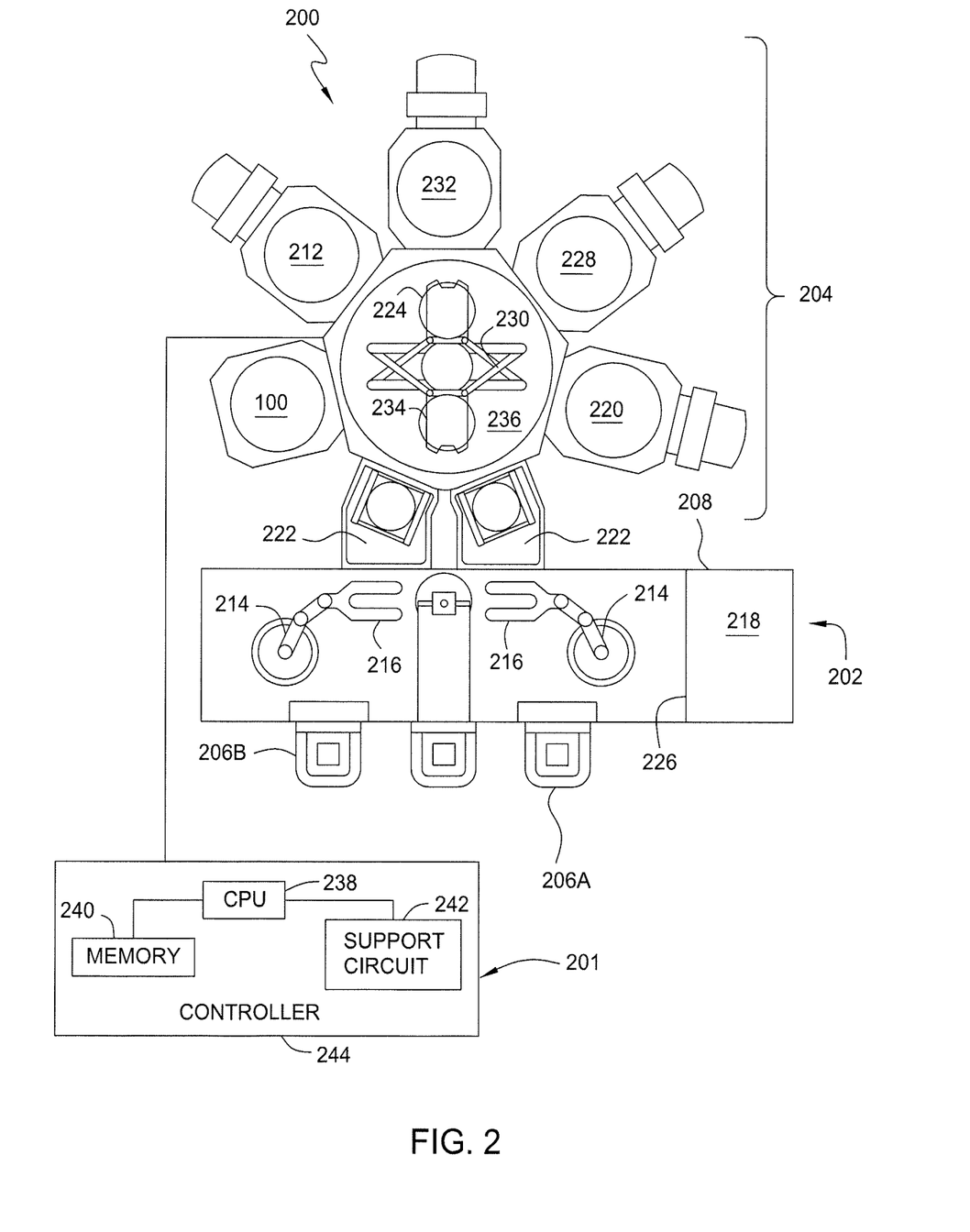
FIG. 2 is a cluster system that the processing chamber of FIG. 1 may be incorporated thereto.

FIG. 2 is a schematic, top plan view of an exemplary processing system 200 that includes one or more of the processing chambers, such as the processing chamber 100 illustrated in FIG. 1, that are incorporated and integrated therein. In one embodiment, the processing system 200 may be a Centura® or Endura® integrated processing system, commercially available from Applied Materials, Inc., located in Santa Clara, Calif. It is contemplated that other processing systems (including those from other manufacturers) may be adapted to benefit from the disclosure.

The system 200 includes a vacuum-tight processing platform 204, a factory interface 202, and a system controller 244. The platform 204 includes a plurality of processing chambers 100, 212, 232, 228, 220, such as the one of the processing chamber 100 depicted in FIG. 1, and at least one load-lock chamber 222 that is coupled to a vacuum substrate transfer chamber 236. Two load lock chambers 222 are shown in FIG. 2. The factory interface 202 is coupled to the transfer chamber 236 by the load lock chambers 222.

In one embodiment, the factory interface 202 comprises at least one docking station 208 and at least one factory interface robot 214 to facilitate transfer of substrates. The docking station 208 is configured to accept one or more front opening unified pod (FOUP). Two FOUPS 206A-B are shown in the embodiment of FIG. 2. The factory interface robot 214 having a blade 216 disposed on one end of the robot 214 is configured to transfer the substrate from the factory interface 202 to the processing platform 204 for processing through the load lock chambers 222. Optionally, one or more metrology stations 518 may be connected to a terminal 226 of the factory interface 202 to facilitate measurement of the substrate from the FOUPS 206A-B.

Each of the load lock chambers 222 have a first port coupled to the factory interface 202 and a second port coupled to the transfer chamber 236. The load lock chambers 222 are coupled to a pressure control system (not shown) which pumps down and vents the load lock chambers 222 to facilitate passing the substrate between the vacuum environment of the transfer chamber 236 and the substantially ambient (e.g., atmospheric) environment of the factory interface 202.

The transfer chamber 236 has a vacuum robot 230 disposed therein. The vacuum robot 230 has a blade 234 capable of transferring substrates 224 among the load lock chambers 222, the metrology system 210 and the processing chambers 212, 232, 228, 220.

In one embodiment of the system 200, the system 200 may include one or more processing chambers 100, 212, 232, 228, 220, which may be a annealing chamber (e.g., high pressure annealing chamber, RTP chamber, laser anneal chamber), deposition chamber, etch chamber, cleaning chamber, curing chamber, or other similar type of semiconductor processing chambers. In some embodiments of the system 200, one or more of processing chambers 100, 212, 232, 228, 220, the transfer chamber 236, the factory interface 202 and/or at least one of the load lock chambers 222.

The system controller 244 is coupled to the processing system 200. The system controller 244, which may include the computing device 201 or be included within the computing device 201, controls the operation of the processing system 200 using a direct control of the process chambers 100, 212, 232, 228, 220 of the system 200. Alternatively, the system controller 244 may control the computers (or controllers) associated with the process chambers 100, 212, 232, 228 and the system 200. In operation, the system controller 244 also enables data collection and feedback from the respective chambers to optimize performance of the system 200.

The system controller 244, much like the computing device 201 described above, generally includes a central processing unit (CPU) 238, a memory 240, and support circuit 242. The CPU 238 may be one of any form of a general purpose computer processor that can be used in an industrial setting. The support circuits 242 are conventionally coupled to the CPU 238 and may comprise cache, clock circuits, input/output subsystems, power supplies, and the like. The software routines transform the CPU 238 into a specific purpose computer (controller) 244. The software routines may also be stored and/or executed by a second controller (not shown) that is located remotely from the system 200.

Figure 3:
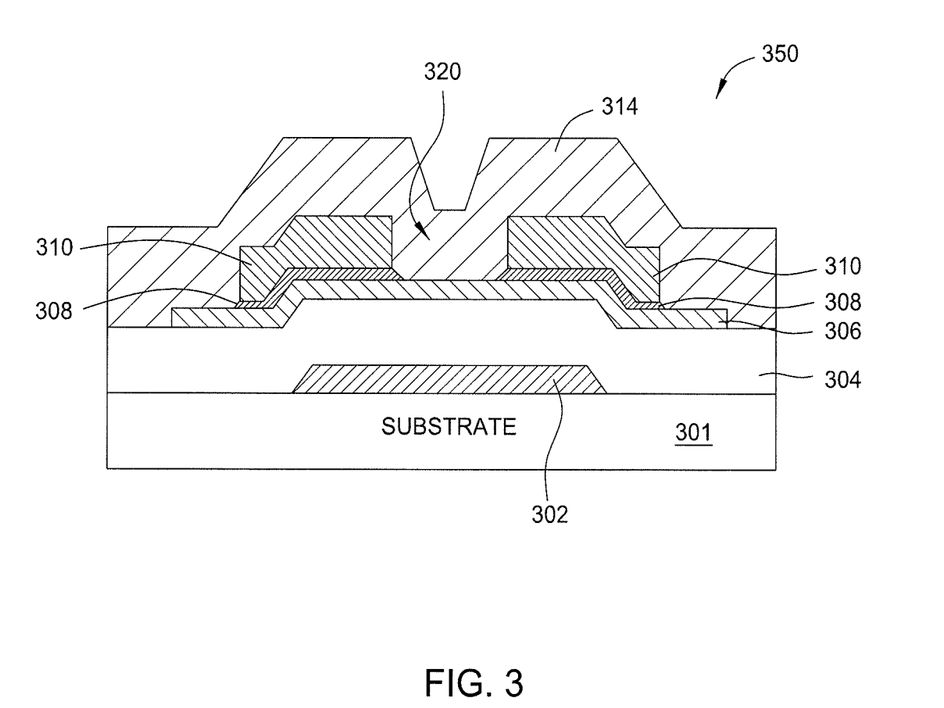
FIG. 3 is a sectional view of one example of a thin film transistor device structure.

FIG. 3 depicts an example of a TFT device 350 that include a metal containing layer that may undergo a thermal annealing process in a high pressure annealing chamber, such as the high pressure annealing process 100 depicted in FIG. 1, which may be incorporated into the system 200 depicted in FIG. 2. The thin film transistor device structure 350 is a bottom gate TFT structure disposed on a substrate 301. It is noted that the substrate 301 may have different combination of films, structures or layers previously formed thereon to facilitate forming different device structures or different film stack on the substrate 301. In one example, the substrate 301 may have the device structure 350 formed thereon, as shown in FIG. 3. Alternatively, the substrate 301 may have another device structure 450 disposed thereon, as further shown in FIG. 4, which will be further described below. The substrate 301 may be any one of glass substrate, plastic substrate, polymer substrate, metal substrate, singled substrate, roll-to-roll substrate, or other suitable transparent substrate suitable for forming a thin film transistor thereon.

A gate electrode layer 302 is formed and patterned on the substrate 301 followed by a gate insulator layer 304. In one embodiment, the gate electrode layer 302 may be fabricated from any suitable metallic material, such as aluminum (Al), tungsten (W), chromium (Cr), tantalum (Ta), molybdenum (Mo), copper (Cu) or combination thereof. Suitable materials for the gate insulator layer 304 include silicon oxide ($SiO_2$), silicon oxynitride (SiON), silicon nitride (SiN), and the like. It is noted that the thin film transistor device structure 350 depicted in FIG. 3 is a bottom gate device structure with the gate electrode layer 302 formed on a bottom of the device structure 350.

An active layer 306 is formed on the gate insulator layer 304. The material utilized for the active layer 306 may be selected from a transparent metallic oxide material that has high electron mobility that is suitable low temperature manufacturing that allows flexible substrate materials, such as plastic materials, to be processed at a low temperature without substrate damage. Suitable examples of materials that can be utilized for the active layer 306 include a-IGZO (amorphous indium gallium zinc oxide), InGaZnON, ZnO, ZnON, ZnSnO, CdSnO, GaSnO, TiSnO, $CuBO_2$, $CuAlO_2$, $CuGaO_2$, SrCuO, LaCuOS, GaN, InGaN, AlGaN or InGaAlN, among others.

After formation of the active layer 306, a barrier layer 308 may be formed on the active layer 306. The barrier layer 308 may be formed from a metal containing material so as to provide a good interface adhesion as well as good barrier properties (e.g., diffusion barrier) to a metal electrode layer 310 (e.g., for a source-drain electrode) subsequently formed thereon. The barrier layer 308 may be patterned to form a desired pattern on the active layer 306 to facilitate transfer of features on the film layers disposed on the substrate 301 in the subsequent etching processes. Although the barrier layer 308 as depicted in FIG. 3 is patterned to a desired pattern, it is noted that the barrier layer 308 could be in any form, including a whole continuous blank film in the device structure 350 or any different features as needed as long as the barrier layer 308 may efficiently provide a blocking/diffusion barrier property to prevent elements from the active layer 306 diffusing into the metal electrode layer 310, or vice versa. In one embodiment, the barrier layer 308 may be a single layer of a metal containing dielectric layer, as depicted in FIG. 3, fabricated by a metal dielectric layer, such as $Ta_2O_5$ or $TiO_2$, or any suitable metal dielectric layer as needed. In another embodiment, the barrier layer 308 may be in form of a composite film as needed.

After the metal electrode layer 310, such as a source-drain metal electrode layer, is disposed over the barrier layer 308, subsequently, an etching process is performed to form a channel 320 in the metal electrode layer 310. After etching, an insulating material layer 314, such as a passivation layer, is then formed over the metal electrode layer 310 to complete the process of forming the thin film transistor device structure 350.

In one embodiment, examples of materials that may be used as the metal electrode layer 310 include copper (Cu), gold, silver (Ag), aluminum (Al), tungsten (W), molybdenum (Mo), chromium (Cr), tantalum (Ta), alloys thereof and combination thereof. Suitable of materials that may be used as the insulating material layer 314 include silicon oxide ($SiO_2$), silicon oxynitride (SiON), or silicon nitride (SiN), and the like.

Figure 4:
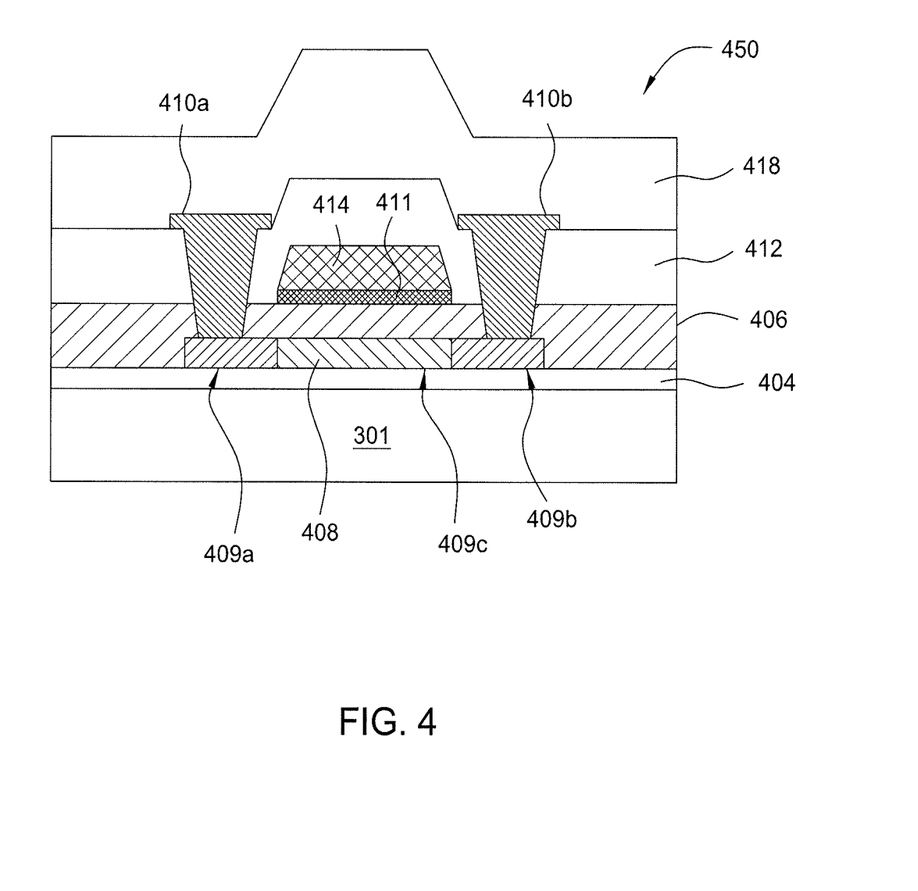
FIG. 4 is a sectional view of another example of a thin film transistor device structure.

FIG. 4 depicts an example of a top gate low temperature polysilicon (LTPS) TFT device structure 450 may be formed on the substrate 301, rather than the bottom gate device structure 350 depicted in FIG. 3. The LTPS TFT devices 450 are MOS devices built with active layers 452 including a source region 409a, channel region 408, and drain region 409b (e.g., or called metal contact regions, or source-drain metal contacts) formed on the optically transparent substrate 301 with or without an optional insulating layer 404 disposed thereon. In one example, the active layer including the source region 409a, channel region 408, and drain region 409b may be fabricated from a transparent metal containing layer, such as metallic oxide material, that has high electron mobility that is suitable low temperature manufacturing that allows flexible substrate materials, such as plastic materials, to be processed at a low temperature without substrate damage. Suitable examples of such materials that can be utilized for the source region 409a, channel region 408, and drain region 409b include a-IGZO (amorphous indium gallium zinc oxide), doped IGZO, InGaZnON, ZnO, ZnON, ZnSnO, CdSnO, GaSnO, TiSnO, $CuBO_2$, $CuAlO_2$, $CuGaO_2$, SrCuO, LaCuOS, GaN, InGaN, AlGaN or InGaAlN, among others.

A gate insulating layer 406 is then deposited on top of the deposited polysilicon layer(s) to isolate a barrier layer 411 and a metal electrode layer 414, such as a gate electrode, disposed thereon from the channel region 408, source region 409a and drain region 409b. The barrier layer 411 may be formed from a metal containing material so as to provide a good interface adhesion as well as good barrier properties (e.g., diffusion barrier) to the metal electrode layer 414 (e.g., the gate electrode) subsequently formed thereon. The barrier layer 411 may be patterned to form a desired pattern on the gate insulating layer 406 to facilitate transfer of features on the film layers disposed on the substrate 102 in the subsequent etching processes. The barrier layer 411 may efficiently provide a blocking/diffusion barrier property to prevent elements from the gate insulating layer 406 diffusing into the metal electrode layer 414, or vice versa. In one embodiment, the barrier layer 411 may be a single layer of a metal containing dielectric layer, as depicted in FIG. 4, fabricated by a metal dielectric layer, such as $Ta_2O_5$ or $TiO_2$, or any suitable metal dielectric layer as needed. In another embodiment, the barrier layer 411 may be in form of a composite film as needed.

The gate electrode layer 414 is formed on top of the gate insulating layer 406 with the barrier layer 411 interposed therebetween. The gate insulating layer 406 is also commonly known as a gate oxide layer since it is commonly made of a silicon dioxide ($SiO_2$) layer. An insulating material layer 412, such as an interlayer insulator, and device connections (not shown) are then made through the insulating material layer 412 to allow control of the TFT devices.

After the insulating material layer 412 is formed, a source-drain metal electrode layer 410a, 410b is then deposited, formed and patterned in the insulating material layer 412. After the source-drain metal electrode layer 410a, 410b is patterned, a passivation layer 418 is then formed over the source-drain metal electrode layer 410a, 410b.

Figure 5:
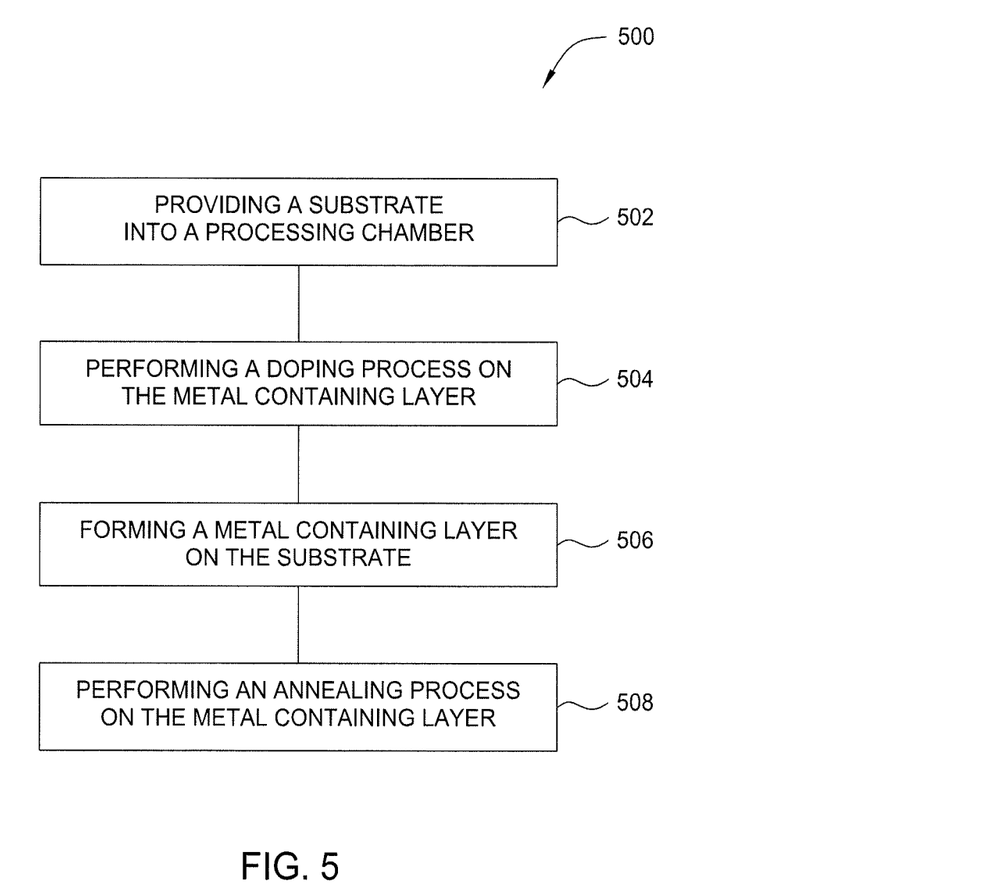
FIG. 5 depicts a flow diagram of an annealing process performed in a metal containing material in accordance with some embodiments.

FIG. 5 depicts a flow diagram of one example of a thermal annealing process 500 performed on a metal containing layer, such as the active layers 306, 452 in FIGS. 3-4, or the metal electrodes 302, 310, 410a, 410b, 414 in FIGS. 3-4 respectively.

Figure 6A:
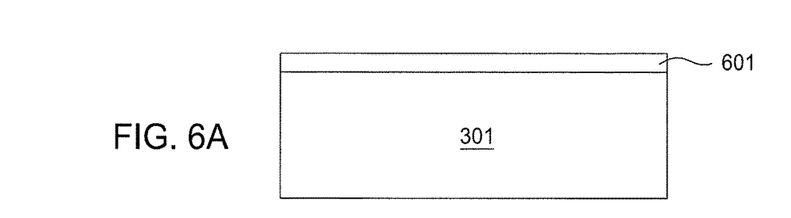
FIGS. 6A-6D depict one embodiment of a sequence for thermal annealing the metal containing material of FIG. 5 in accordance with some embodiments.

The method 500 begins at operation 502 by providing a substrate, such as the substrate 301 in FIGS. 3 and 4. The substrate 301 may be an optical transparent substrate. The substrate 301 may comprise a material layer 601 disposed thereon, as shown in FIG. 6A. The material layer 601 may be a single layer or multiple layers that may be utilized to form a TFT device structure. Alternatively, the material layer 601 may be a structure may include multiple materials that may be utilized to form a TFT device structure.

Figure 6B:
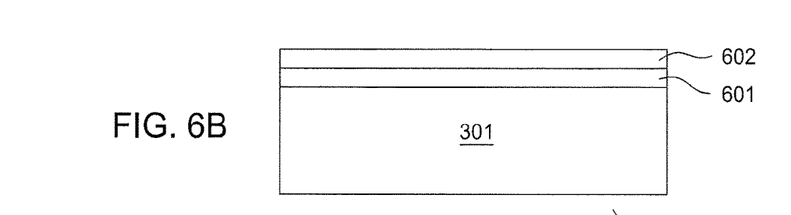

The substrate 301 further includes a metal containing layer 602 formed on the material layer 601, as shown in FIG. 6B. In the examples wherein the material layer 601 is not present, the metal containing layer 602 may be directly formed on the substrate 301. In some examples, the metal containing layer 602 may be used as the active layers 306, 452 in FIG. 3 or 4, or the metal electrodes 302, 310, 410a, 410b, 414 in FIGS. 3-4. In an example, the metal containing layer 602 is a metal oxide layer selected from a group consisting of a-IGZO (amorphous indium gallium zinc oxide), doped IGZO, InGaZnON, ZnO, ZnON, ZnSnO, CdSnO, GaSnO, TiSnO, $CuBO_2$, $CuAlO_2$, $CuGaO_2$, SrCuO, LaCuOS, GaN, InGaN, AlGaN or InGaAlN and the like. In one example, the metal containing layer 602 is a IGZO or doped IGZO layer. Alternatively, the metal containing layer 602 may be a metal layer, such as copper (Cu), gold, silver (Ag), aluminum (Al), tungsten (W), molybdenum (Mo), chromium (Cr), tantalum (Ta), alloys thereof, or the like.

Figure 6C:
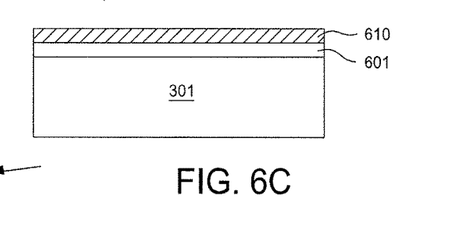

At operation 504, an optional ion doping/implantation process is performed to implant ions into the metal containing layer 602, forming a doped metal containing layer 610, as shown in FIG. 6C. In the examples wherein the ion implantation process is eliminated, the thermal annealing process at operation 506, which will be described in greater detail below, may be performed directly on the metal containing layer 602. The ion doping/implantation process is performed to dope, coat, treat, implant, insert or modify certain film/surface properties on certain locations of the metal containing layer 602 with dopants formed into, forming the doped metal containing layer 610. The ion doping/implantation process utilizes incident ions to modify film/surface properties on the metal containing layer 602, with dopants doped thereto to form the doped metal containing layer 610. The ion doping/implantation process may be performed in any suitable ion implantation/doping processing tools. The ions, which include a desired type of atoms, may be doped into the metal containing layer 602 with desired concentration. The ions doped into the metal containing layer 602 may modify the film/surface properties of the metal containing layer 602, which may affect, improve or alter the lattice structure, degree of crystalline, bonding structure or film density of the metal containing layer 602, forming the doped metal containing layer 610.

In the embodiment wherein the metal containing layer 602 includes InGaZnO, the ions doped into the metal containing layer 602 may include indium (In) or molybdenum (Mo), gallium (Ga), zinc (Zn) and the like. It is believed that In or Mo dopants doped into the metal containing layer 602 (e.g., a InGaZnO) may alter the electrical properties such as high mobility, crystallinity (e.g., from amorphous structure, C-axis aligned crystalline structure (CAAC), polycrystalline structure or even single crystalline structure) of the InGaZnO material, thus, providing the doped metal containing layer 610 with desired film properties. For example, higher degree of the crystallinity provided by the In or Mo dopants in the InGaZnO material is believed to increase the electron mobility of the film properties, thus enhancing the electrical performance of the TFT device structure or semiconductor devices, when doped metal containing layer 610 is utilized thereof.

Furthermore, it is also believed that the gallium (Ga) and zinc oxide (ZnO) ratio included in the InGaZnO material may also affect the resultant lattice structure of the doped metal containing layer 610. It is believed the ratio of Ga elements included in the InGaZnO material may increase the film transparency as well as the overall film bandgap. The ratio of Zn or ZnO elements included in the InGaZnO material may increase the mobility as well as the reducing the thermal annealing temperature requirements for crystallinity enhancement. Thus, by selecting a proper dosage of the In dopants into the InGaZnO material, a desired crystalline of the InGaZnO material may be obtained. Furthermore, the desired crystalline of the InGaZnO material may also help reducing the temperature requirement in the following thermally annealing process at operation 506, providing process advantages in TFT device applications as the substrate 301 is often optical transparent material with relatively low thermal cycle budges.

In one embodiment, the resultant In dopant in the InGaZnO material may have a doping concentration of between about 5E15 ions/$cm^2$ and about 9E15 ions/$cm^2$, such as about 8.5E15 ions/$cm^2$, formed in the doped metal containing layer 610. Furthermore, the ratio of the In or Mo element in the InGaZnO material may be increased from about 10%-13% to about 14%-16% (between about 15% and about 30% increase) by atomic weight.

Several process parameters may be controlled during the ion doping/implantation process. The ion doping/implantation process may be performed by supplying an ion doping gas mixture into the ion doping/implantation tool along with a desired amount of the power energy to dope the ions from the ion doping gas mixture into the substrate 301. The ion doping gas mixture may be supplied into the ion doping/implantation tool at a flow rate between about 10 sccm and about 1000 sccm. Suitable elements for supplying in the ion doping used in vapor state during implant include indium vapor and molybdenum vapor. A RF power, such as capacitive or inductive RF power, DC power, electromagnetic energy, ion beam, or magnetron sputtering, may be supplied into the ion doping/implantation process to assist dissociating the ion doping gas mixture during processing. Ions generated by the dissociative energy may be accelerated toward the substrate using an electric field produced by applying a DC or RF electrical bias to the substrate support or to a gas inlet above the substrate support, or both. In some embodiments, the gas containing energetic ions may be a plasma. An energy of between about 20 keV and about 80 keV, such as between about 35 keV and about 55 keV, for example about 45 keV, may be used to implant ions into the metal containing layer 602. The substrate temperature may be controlled at between about 5 degrees Celsius and about 50 degrees Celsius, such as about 15 degrees Celsius.

Figure 6D:
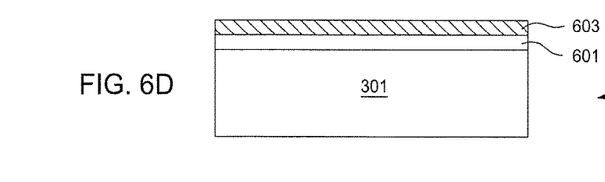

At operation 506, a high pressure annealing process is performed. The annealing process performed at high process pressure, such as greater than 2 bar but less than, may assist densifying and repairing the vacancies in the doped metal containing layer 610, forming the annealed metal containing layer 603 with the desired film properties, as shown in FIG. 6D. In some examples, the high process pressure may go up to 100 bar. In the embodiment wherein the ion doping/implantation process at operation 504 is not performed, the high pressure annealing process may be performed directly on the metal containing layer 602 from FIG. 6B to form the annealed metal containing layer 603, as shown in FIG. 6D. The annealing process may be performed at a processing chamber, such as the processing chamber 100 depicted in FIG. 1, or other suitable processing chambers, including those that process substrate one at a time.

The high pressure annealing process performed at operation 506 maintains processing pressure at the high-pressure region in a vapor phase, for example in a dry vapor phase that has substantially no liquid droplets present. The processing pressure and temperature is controlled to density the film structures, so as to repair the film defects, driving out impurities and increasing film density. In one example, the high-pressure region 115 is pressurized to a pressure greater than atmosphere, for example greater than about 2 bar. In another example, the high-pressure region 115 is pressurized to a pressure from about 5 to about 100 bars, such as from about 5 to about 50 bars, such as about 35 bar. As the high pressure may efficiently assist densifying the film structure, a relatively low processing temperature, such as less than 500 degrees Celsius, to reduce likelihood of thermal cycle damage to the substrate 301.

During processing, the high-pressure region 115 is maintained at a relatively low temperature, for example, a temperature less than 500 degrees Celsius, such as between about 150 degrees Celsius and about 350 degrees Celsius, by the heaters 122 disposed within the outer chamber 110. Thus, a low thermal budget to the substrate may be obtained by utilizing the high pressure annealing process along with low temperature regime.

It is believed that the high pressure process may provide a driving force to drive out the dangling bonds in the metal containing layer 602 or the doped metal containing layer 610, thus, repairing, reacting and saturating the dangling bonds in the metal containing layer 602 during the annealing process. In one example, an oxygen containing gas, such as $O_3$ gas, $O_2$ gas, air, $H_2O$, $H_2O_2$, $N_2O$, $NO_2$, $CO_2$, CO and dry steam, or chalcogen vapor including sulfur (S) vapor and selenium (Se) vapor, or tellurium vapor or other suitable gases may be supplied during the annealing process. In one specific example, the oxygen containing gas comprises steam, for example, dry steam and/or air. The oxygen elements from the oxygen containing gas during the annealing process may be driven into the metal containing layer 602, altering the bonding structures and removing the atomic vacancies therein, thus, densifying and enhancing lattice structures and increasing the crystallinity of the metal containing layer 602. In some examples, an inert gas or a carrier gas, such as Ar, $N_2$, He, Kr and the like, may be supplied with the oxygen containing gas. In one embodiment, the oxygen containing gas supplied in the oxygen containing gas mixture is dry steam supplied at a pressure greater than 2 bar.

In one exemplary implementation, a process pressure is regulated at a pressure greater than 2 bar, such as between 5 bar and 100 bar, such as between 20 bar and about 80 bar, for example between about 25 bar and 75 bar, such as about 35 bar. The process temperature may be controlled at greater than 150 degrees Celsius but less than 500 degrees Celsius, such as between about 150 degrees Celsius and about 380 degrees Celsius, such as between about 180 degrees Celsius and about 400 degrees Celsius. In one example, chalcogen vapor, such as sulfur (S) vapor, selenium (Se) vapor, may be supplied during the annealing process for metal oxychalcogen, such as InGaZnO comprising S or Se.

After the annealing process at high pressure, the metal containing layer 602 or the doped metal containing layer 610 has a densified film structure, which provides a relatively robust film structure with amorphous morphology that provides higher film density, high film mobility, low carrier concentration and low film resistivity as compared to the metal containing layer 602 or doped metal containing layer 610 annealed by a conventional annealing process at a pressure around one atmospheric pressure, while both annealing process are at the same anneal temperature. In one example, the mobility of the high pressure annealed metal containing layer 603 with indium dopants (formed from the doped metal containing layer 610) is increased between about 5 times and about 20 times, resistivity increased about 10 times and carrier concentration decreased about 100 times, as compared to a conventional annealing process at 1 atmospheric pressure while under the same anneal temperature.

In one example, the mobility of the high pressure annealed metal containing layer 603 without indium dopants (formed from the metal containing layer 602) is increased between about 1.5 times and about 5 times, resistivity increased from about 20 percent to about 99 percent and carrier concentration decreased about 100 times, as compared to a conventional annealing process at 1 atmospheric pressure while under the same anneal temperature.

Thus, methods for thermal annealing a metal containing layer are provided. The metal containing layer may be thermally treated/annealed by a high pressure annealing process with high process pressure, such as greater than 2 bar but less than 50 bar. By utilizing such high pressure annealing process, the process temperature may be maintained less than 500 degrees Celsius, thus reducing the thermal budge contributed to the substrate where the metal containing layer is formed thereon, providing a good film quality with desired crystallinity and structure integration management.

While the foregoing is directed to embodiments of the present invention, other and further embodiments of the invention may be devised without departing from the basic scope thereof, and the scope thereof is determined by the claims that follow.

The invention claimed is:

1. A method of forming a metal containing layer on a substrate comprising:
    supplying an oxygen containing gas mixture on a substrate in a processing chamber, the substrate comprising a metal containing layer disposed on an optically transparent substrate;
    maintaining the oxygen containing gas mixture in the processing chamber at a process pressure between 2 bar and 50 bar; and
    thermally annealing the metal containing layer in the presence of the oxygen containing gas mixture.

2. The method of claim 1, wherein supplying the oxygen containing gas mixture further comprises:
    maintaining a substrate temperature at less than 400 degrees Celsius.

3. The method of claim 1, wherein oxygen containing gas mixture includes at least an oxygen containing gas selected from a group consisting of O3 gas), O2 gas, H2O, H2O2, N2O, NO2, CO2, CO, air, and dry steam.

4. The method of claim 1, wherein oxygen containing gas mixture includes dry steam or air.

5. The method of claim 1, wherein the process pressure is between about 5 bar and 100 bar.

6. The method of claim 1, wherein the metal containing layer is a metal oxide layer.

7. The method of claim 6, wherein the metal oxide layer is selected from a group consisting of a-IGZO (amorphous indium gallium zinc oxide), doped IGZO, InGaZnON, ZnO, ZnON, ZnSnO, CdSnO, GaSnO, TiSnO, CuBO2, CuAlO2, CuGaO2, SrCuO, LaCuOS, GaN, InGaN, AlGaN and InGaAlN.

8. The method of claim 1, further comprising:
implanting dopants into the metal containing layer prior to supplying the oxygen containing gas mixture.

9. The method of claim 8, wherein the dopants implanted into the metal containing layer comprises indium or molybdenum.

10. The method of claim 9, wherein the dopants implanted into the metal containing layer increase crystallinity of the metal containing layer.

11. The method of claim 1, wherein the metal containing layer is an active layer in a TFT device structure.

12. The method of claim 1, wherein the metal containing layer is InGaZnON.

13. The method of claim 1, wherein the metal containing layer is an electrode in a TFT device structure.

14. The method of claim 1, wherein the metal containing layer has a higher mobility after the thermally annealing.

15. The method of claim 1, wherein the metal containing layer has a higher film density after the thermally annealing.

16. A method for densifying a metal containing layer comprising:

thermally treating a metal containing layer disposed on an optically transparent substrate at a pressure between 2 bar and 50 bar; and
maintaining a substrate temperature less than 500 degrees Celsius during thermally treating the metal containing layer.

17. The method of claim 16, further comprising:
supplying dry steam, air, chalcogen vapor or tellurium vapor to the metal containing layer while thermally treating the metal containing layer.

18. The method of claim 16, wherein the metal containing layer is selected from a group consisting of a-IGZO (amorphous indium gallium zinc oxide), doped IGZO, InGaZnON, ZnO, ZnON, ZnSnO, CdSnO, GaSnO, TiSnO, CuBO2, CuAlO2, CuGaO2, SrCuO, LaCuOS, GaN, InGaN, AlGaN and InGaAlN.

19. The method of claim 16, wherein the metal containing layer has a higher mobility after the thermal treating.

20. A method for densifying a metal containing layer disposed on a substrate comprising:
forming a metal containing layer on a substrate;
implanting dopants into the metal containing layer; and
thermally treating the metal containing layer on the substrate at a pressure between 2 bar and 50 bar while maintaining a substrate temperature less than 500 degrees Celsius.

* * * * *